US007355249B2

(12) United States Patent
Clark, Jr. et al.

(10) Patent No.: US 7,355,249 B2
(45) Date of Patent: Apr. 8, 2008

(54) SILICON-ON-INSULATOR BASED RADIATION DETECTION DEVICE AND METHOD

(75) Inventors: William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/908,117

(22) Filed: Apr. 28, 2005

(65) Prior Publication Data

US 2006/0244062 A1 Nov. 2, 2006

(51) Int. Cl.
*H01L 27/01* (2006.01)

(52) U.S. Cl. .............. 257/351; 257/406; 257/360; 257/402; 257/407; 257/E27.112

(58) Field of Classification Search ............... 257/359, 257/360, E21.321, 347, 351, 348, 406–407, 257/402; 438/592
See application file for complete search history.

(56) References Cited

U.S. PATENT DOCUMENTS

| | | | |
|---|---|---|---|
| 4,996,576 A * | 2/1991 | Lynch et al. ............... 257/429 |
| 5,164,805 A * | 11/1992 | Lee .......................... 257/351 |
| 5,532,178 A | 7/1996 | Liaw et al. |
| 6,048,756 A | 4/2000 | Lee et al. |
| 6,268,630 B1 * | 7/2001 | Schwank et al. ........... 257/347 |
| 6,605,843 B1 * | 8/2003 | Krivokapic et al. ........ 257/347 |
| 6,762,068 B1 | 7/2004 | Forbes et al. |
| 7,081,387 B2 * | 7/2006 | Furukawa et al. .......... 438/259 |
| 2002/0043689 A1 * | 4/2002 | Matsuoka et al. .......... 257/368 |
| 2002/0151183 A1 | 10/2002 | Yang et al. |
| 2005/0124099 A1 * | 6/2005 | Beintner et al. ............ 438/164 |
| 2006/0237791 A1 * | 10/2006 | Doris et al. ................ 257/348 |

FOREIGN PATENT DOCUMENTS

JP 06177389 A 6/1994

* cited by examiner

*Primary Examiner*—Zandra V. Smith
*Assistant Examiner*—Tsz K Chiu
(74) *Attorney, Agent, or Firm*—Anthony J. Canale; Hoffman, Warnick & D'Alessandro LLC

(57) ABSTRACT

Structures and a method for detecting ionizing radiation using silicon-on-insulator (SOI) technology are disclosed. In one embodiment, the invention includes a substrate having a buried insulator layer formed over the substrate and an active layer formed over the buried insulator layer. Active layer may be fully depleted. A transistor is formed over the active layer, and includes a first gate conductor, a first gate dielectric and source/drain diffusion regions. The first gate conductor may include a material having a substantially (or fully) depleted doping concentration such that it has a resistivity higher than doped polysilicon such as intrinsic polysilicon. A second gate conductor is formed below the buried insulator layer and provides a second gate dielectric corresponding to the second gate conductor. A channel region between the first gate conductor and the second gate conductor is controlled by the second gate conductor (back gate) such that it acts as a radiation detector.

10 Claims, 1 Drawing Sheet

SILICON-ON-INSULATOR BASED RADIATION DETECTION DEVICE AND METHOD

BACKGROUND OF THE INVENTION

1. Technical Field

The present invention relates generally to semiconductor devices, and more particularly, to a silicon-on-insulator based radiation detection device and method of detecting ionizing radiation.

2. Related Art

Ionizing radiation can cause integrated circuits (IC) to malfunction. Accordingly, the ability to detect ionizing radiation is a key attribute of current semiconductor device technologies. Achieving this detection, however, is becoming increasingly difficult as further miniaturization continues. In particular, the continued miniaturization of the interface between gate and channel, i.e., the gate dielectric or gate oxide, results in smaller and harder to detect signals.

In silicon-on-insulator (SOI) technology, and particularly partially-depleted SOI technology, front gate radiation detection is offered. FIG. 1 shows an illustrative SOI-based semiconductor device 10 including a front gate 12 and back gate 14. "Front gate" indicates a typical transistor structure, while "back gate" refers to a gate in which the silicon substrate forms the gate and a buried insulator layer forms a gate dielectric with source/drain diffusion regions of the front gate. For example, device 10 includes a substrate 20, a buried insulator layer 22 (i.e., BOX for buried oxide) over substrate 20 and an active layer 24 formed over buried insulator layer 22. "Front gate" 12 is provided in the form of a field-effect transistor (FET) over active layer 24 and includes, inter alia, a gate 30, a gate dielectric 32 and source/drain diffusion regions 34. "Back gate" 14 is formed below buried insulator layer 22 and includes part of buried insulator layer 22 acting as a gate dielectric 36 and part of silicon substrate 20 acting as a gate 38. A channel region 40 is formed between front gate 12 and back gate 14. The active part of channel region 40 extends from source to drain. Front gate 12 is referred to as a "strong gate" because it has higher capacitive coupling to channel region 40, and back gate 14 is referred to as a "weak gate" because it has reduced capacitive coupling to channel region 40.

Radiation causes trapped charge in the insulating regions (layer 22 in FIG. 1). This trapped charge alters the device threshold voltage and causes it to leak. The thicker the dielectric layer the stronger the signal, i.e., more leakage per unit trapped charge. General device performance scaling however drives gate dielectric 32 to be as thin as possible. However, the thicker back gate 14 (weak gate) has less control over device leakage due to the presence of the front gate 12 (strong gate). That is, since front gate 12 is the stronger gate, it controls whether current flows through channel region 40. Since back gate 14 typically has a thicker gate dielectric 36, i.e., the buried insulator layer, it provides more sensitive structure to detect ionizing radiation. Unfortunately, because the front gate controls channel region 40, the back gate signal is dominated by the stronger front gate, making radiation detection by the back gate impossible.

In view of the foregoing, there is a need in the art for a semiconductor structure for SOI technology with improved back gate detection.

SUMMARY OF THE INVENTION

The invention includes structures and a method for detecting ionizing radiation using silicon-on-insulator (SOI) technology. In one embodiment, the invention includes a substrate having a buried insulator layer formed over the substrate and an active layer formed over the buried insulator layer. The active layer may be fully depleted. A transistor is formed over the active layer, and includes a first gate conductor, a first gate dielectric and source/drain diffusion regions. The first gate conductor may include a material having a substantially (or fully) depleted doping concentration such that it has a resistivity higher than doped polysilicon such as intrinsic polysilicon. A second gate conductor is formed below the buried insulator layer and provides a second gate dielectric corresponding to the second gate conductor. A channel region between the first gate conductor and the second gate conductor is controlled by the second gate conductor (back gate) such that it acts as a radiation detector. The invention thus increases the sensitivity of the detector by weakening the front gate so that the back gate can control the leakage. This structure is provided selectively, and the remaining FETs do not get this front gate weakening—only the ones needed for radiation detection.

A first aspect of the invention is directed to a structure for detecting ionizing radiation, the structure comprising: a substrate having a buried insulator layer formed over the substrate and an active layer formed over the buried insulator layer; a transistor formed over the active layer, the transistor including a first gate conductor, a first gate dielectric and source/drain diffusion regions, the first gate conductor including a material having a substantially depleted doping concentration; a second gate conductor formed below the buried insulator layer, wherein a portion of the buried insulator layer provides a second gate dielectric corresponding to the second gate conductor; and a channel region between the first gate conductor and the second gate conductor, wherein the second gate conductor controls the channel region.

A second aspect of the invention includes a structure for detecting ionizing radiation, the structure comprising: a silicon-on-insulator structure including a substrate having a buried insulator layer formed over the substrate and an active layer formed over the buried insulator layer, the active layer having a doping level and thickness such that the active layer is fully depleted; a field-effect transistor (FET) formed over the active layer, the FET including a first gate dielectric, source/drain diffusion regions and a first gate conductor including a material having a substantially depleted doping concentration; a second gate conductor formed below the buried insulator layer, wherein a portion of the buried insulator layer provides a second gate dielectric corresponding to the second gate conductor; and a channel region between the first gate conductor and the second gate conductor, wherein the second gate conductor controls the channel region.

A third aspect of the invention relates to a method of forming a radiation detector in silicon-on-insulator technology, the method comprising: forming a substrate having a buried insulator layer over the substrate and an active layer formed over the buried insulator layer, the active layer having a doping level and thickness such that the active layer is fully depleted; forming a transistor over the active layer, the transistor including a first gate conductor including intrinsic polysilicon, a first gate dielectric and source/drain diffusion regions; forming a second gate conductor below the buried insulator layer, wherein a portion of the buried insulator layer provides a second gate dielectric corresponding to the second gate conductor; and detecting radiation by controlling a channel region between the first gate conductor and the second gate conductor via the second gate conductor.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION

Figure 1:
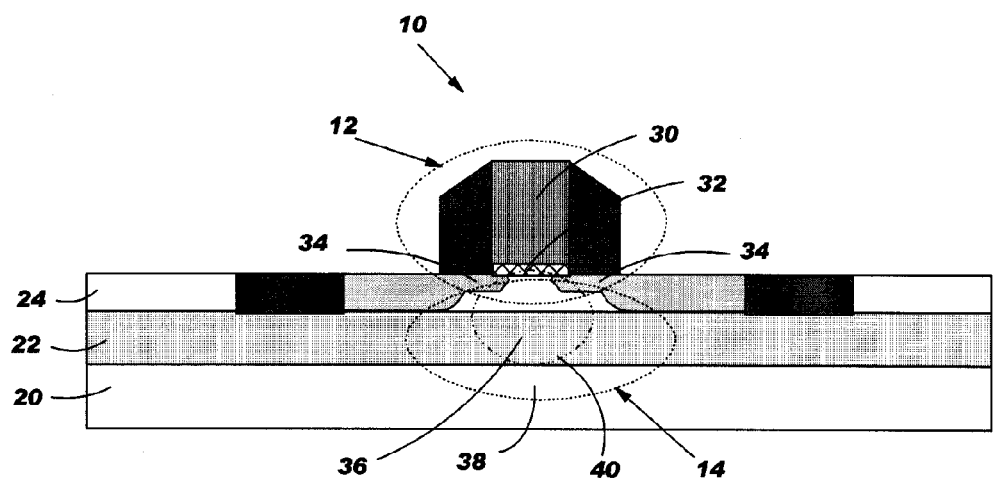
FIG. 1 shows a conventional silicon-on-insulator structure in which the front gate controls the channel region.
Figure 2:
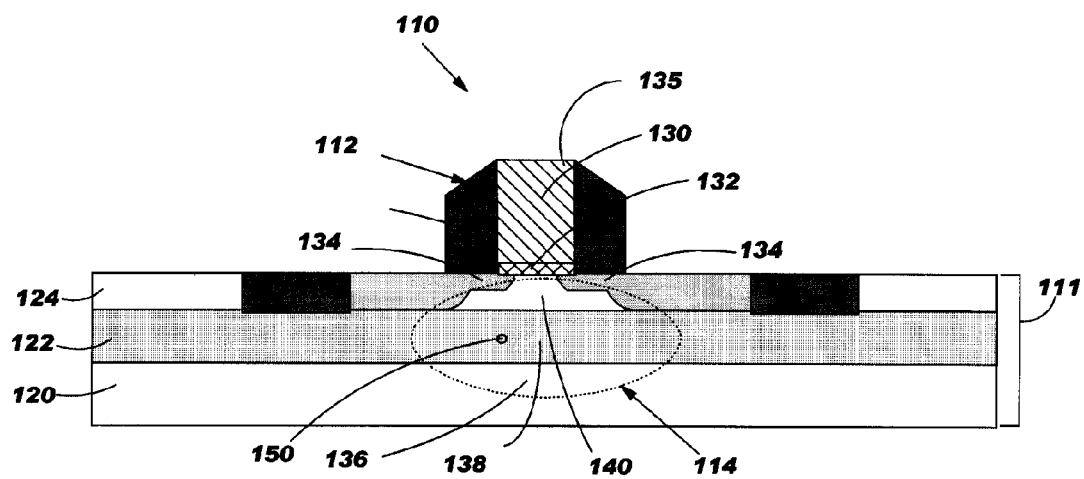
FIG. 2 shows a silicon-on-insulator structure for detecting ionizing radiation in which the back gate controls the channel region according to the invention.

With reference to the accompanying drawings, FIG. 2 shows a structure 110 for detecting ionizing radiation. Structure 110 includes a silicon-on-insulator structure 111 having a substrate 120, a buried insulator layer 122 formed over substrate 120 and an active layer 124 formed over buried insulator layer 122. Substrate 120 includes silicon. Buried insulator layer 122 may include any now known or later developed SOI insulator materials such as silicon dioxide. Active layer 124 may include, for example, silicon, and as will be described more in detail below, preferably has a doping level and thickness low enough such that the silicon thickness used as the active layer is fully depleted.

A transistor 112 is formed over active layer 124, and provides a front gate. Transistor 112 may be in the form of a field-effect transistor (FET) and include a first gate conductor 130, a first gate dielectric 132 and source/drain diffusion regions 134. First gate dielectric 132 may include any now known or later developed material for such use, e.g., silicon dioxide. First gate conductor 130, however, includes a material having a substantially (or fully) depleted doping concentration such that it has a resistivity higher than doped polysilicon such as intrinsic polysilicon. "Substantially depleted doping concentration" means that the doping concentration is sufficiently low that a depletion zone is formed in the material (e.g., polysilicon) extending through most or all of first gate conductor 130. In the depletion zone nearly all (>99%) of the (normally present) free charge carriers are absent. "Intrinsic polysilicon" is a polysilicon that is substantially undoped material, i.e., a polysilicon which has a substantially depleted doping concentration. As a result, first gate conductor 130 is 'weaker' than a conventional operational transistor gate, i.e., it requires more power to turn it on. In one embodiment, first gate conductor 130 may also include a portion 135 (edges) doped with an impurity, however, this is not necessary. In particular, since conventional processes dope first gate conductor 130 and source/drain diffusion regions 134 simultaneously, it is nearly impossible to prevent all doping of first gate conductor 130 since it cannot be masked perfectly. As a result, the invention allows portion 135 (edges) of first gate conductor 130 to become doped while maintaining the center region intrinsic rather than allow the intolerable doping of the edges of source/drain diffusion regions 134. The impurity may include, for example, standard n and p type doping ions such as boron, phosphorus, arsenic, etc.

A back gate 114 is provided by a second gate conductor 136 formed below buried insulator layer 122, i.e., in a region of substrate 120. In this case, a portion of buried insulator layer 122 provides a second gate dielectric 138 corresponding to second gate conductor 136.

A channel region 140 is formed between first gate conductor 130 and second gate conductor 136. In addition to first gate conductor 130 being weakened, structure 110 may also include an active layer 124 that is fully depleted, i.e., it is devoid of any free carriers such that a potential extends all the way through channel region 140 between first gate conductor 130 and buried insulator layer 122. In operation, ionizing radiation generates a charge 150 in second gate dielectric 138. The ionizing radiation may include a high energy ionizing radiation such as a gamma ray, an alpha particle or any other high energy radiation. "High energy" means an energy level that is sufficient to produce hole-electron pairs in the dielectric, which typically is greater than a few eV (electron-Volts). Charge 150 can be detected by back gate 114 being turned on. That is, radiation can be detected by controlling channel region 140 between first gate conductor 130 and second gate conductor 136 via second gate conductor 136.

The invention also includes a method of forming a radiation detector in silicon-on-insulator technology. The method employs conventional techniques to generate the above-described structure 110. The method includes the following steps. First, forming substrate 120 having buried insulator layer 122 over substrate 120 and active layer 124 formed over buried insulator layer 122. As described above, active layer 124 preferably has a doping level such that the active layer is fully depleted. A transistor 112 is formed over active layer 124, and includes first gate conductor 130 including intrinsic polysilicon, first gate dielectric 132 and source/drain diffusion regions 134. A second gate conductor 136 is formed below buried insulator layer 122 via substrate 120. A portion of buried insulator layer 138 provides a second gate dielectric corresponding to second gate conductor 136. Radiation can then be detected by controlling channel region 140 between first gate conductor 130 and second gate conductor 136 via second gate conductor 136. In particular, a pulse charge 150 can be detected through charge induced threshold voltage shift.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A structure for detecting ionizing radiation, the structure comprising:

a substrate having a buried insulator layer formed over the substrate and an active layer formed over the buried insulator layer, the active layer having a doping level and thickness such that the active layer is fully depleted;

a transistor formed over the active layer, the transistor including a first gate conductor, a first gate dielectric, and source/drain diffusion regions, the first gate conductor including a material having a substantially depleted doping concentration, the first gate conductor further including intrinsic polysilicon and a portion doped with an impurity;

a second gate conductor formed in the substrate and below the buried insulator layer, wherein a portion of the buried insulator layer provides a second gate dielectric corresponding to the second gate conductor; and a channel region between the first gate conductor and the second gate conductor, wherein the second gate conductor controls the channel region.

2. The structure of claim 1, wherein the second gate conductor includes a region of the substrate.

3. The structure of claim 1, wherein the ionizing radiation generates charge in the second gate dielectric.

4. The structure of claim 1, wherein the ionizing radiation includes a high energy ionizing radiation.

5. The structure of claim 4, wherein the high energy ionizing radiation includes one of a gamma ray and an alpha particle.

6. A structure for detecting ionizing radiation, the structure comprising:

a silicon-on-insulator structure including a substrate having a buried insulator layer formed over the substrate and an active layer formed over the buried insulator layer, the active layer having a doping level and thickness such that the active layer is fully depleted;

a field-effect transistor (FET) formed over the active layer, the FET including a first gate dielectric, source/drain diffusion regions, and a first gate conductor including a material having a substantially depleted doping concentration, the first gate conductor further including intrinsic polysilicon and a portion doped with an impurity;

a second gate conductor formed in the substrate and below the buried insulator layer, wherein a portion of the buried insulator layer provides a second gate dielectric corresponding to the second gate conductor; and a channel region between the first gate conductor and the second gate conductor, wherein the second gate conductor controls the channel region.

7. The structure of claim 6, wherein the second gate conductor includes a region of the substrate.

8. The structure of claim 6, wherein the ionizing radiation generates charge in the second gate dielectric.

9. The structure of claim 6, wherein the ionizing radiation includes a high energy ionizing radiation.

10. The structure of claim 9, wherein the high energy ionizing radiation includes a gamma ray.

* * * * *